United States Patent [19]

Suzuki

[11] Patent Number: 5,403,757
[45] Date of Patent: Apr. 4, 1995

[54] METHOD OF PRODUCING A DOUBLE-POLYSILICON BIPOLAR TRANSISTOR

[75] Inventor: Hisamitsu Suzuki, Tokyo, Japan

[73] Assignee: NEC Corporation, Japan

[21] Appl. No.: 114,005

[22] Filed: Aug. 30, 1993

[30] Foreign Application Priority Data

Aug. 31, 1992 [JP] Japan .................. 4-232475

[51] Int. Cl.⁶ ............................................ H01L 21/265
[52] U.S. Cl. .................................. 437/31; 437/162;
437/191; 257/588
[58] Field of Search ............... 437/31, 162, 191, 186,
437/187, 189; 257/587, 588

[56] References Cited

U.S. PATENT DOCUMENTS

| 4,648,937 | 3/1987 | Ogura et al. | 156/646 |
|---|---|---|---|
| 4,671,970 | 6/1987 | Keiser et al. | 437/61 |
| 4,731,341 | 3/1988 | Kawakatsu | 437/313 |
| 4,753,709 | 6/1988 | Welch et al. | 437/31 |
| 4,975,381 | 12/1990 | Taka et al. | 257/588 |
| 5,010,039 | 4/1991 | Ku et al. | 437/31 |
| 5,026,654 | 6/1991 | Tanba et al. | 437/31 |
| 5,037,768 | 8/1991 | Cosentino | 437/31 |
| 5,109,262 | 4/1992 | Kadota et al. | 257/587 |
| 5,192,992 | 3/1993 | Kim et al. | 437/31 |
| 5,198,372 | 3/1993 | Verret | 437/31 |
| 5,232,861 | 8/1993 | Miwa | 437/162 |
| 5,279,976 | 1/1994 | Hayden et al. | 437/162 |
| 5,354,699 | 10/1994 | Ikeda et al. | 437/162 |

FOREIGN PATENT DOCUMENTS 0119265 5/1988 Japan ...................... 437/31

*Primary Examiner*—Olik Chaudhuri
*Assistant Examiner*—Long Pham
*Attorney, Agent, or Firm*—Laff, Whitesel, Conte & Saret, Ltd.

[57] ABSTRACT

A double-layered structure of the base electrode corresponding to the emitter diffused-region 15 to be formed, which consists of the first and second conducting films 5, 6. This structure effects to prevent the surface of the silicon substrate in the emitter diffused-region to be formed from being etched away by the overetching for forming the base electrode, with much reduction of leakage current due to the consequent damage to the silicon-substrate surface in the emitter diffused-region to be formed, leading to improvement in transistor yield.

4 Claims, 7 Drawing Sheets

METHOD OF PRODUCING A DOUBLE-POLYSILICON BIPOLAR TRANSISTOR

BACKGROUND OF THE INVENTION

1. Field of the Invention

This invention relates to a method for producing a bipolar transistor fabricated in a semiconductor IC.

2. Description of the Prior Art

It is required more and more that a bipolar transistor in an IC operates at a high speed. For this purpose, it is known to make the distance between an emitter region and an extrinsic (or outer) base region as short as possible. To this end, the emitter region is formed in an intrinsic base region in a self-aligned matter with the extrinsic base region.

More specifically, as shown in FIG. 1, a semiconductor body is prepared, which includes a p-type semiconductor substrate 1, an n-type epitaxial layer 3, an n-type buried layer 2 formed between the substrate 1 and layer 3, a collector contact region 7, and a field insulating film 4 selectively formed on the layer 3. After exposing a surface portion of the layer 3 in which the base and emitter regions are to be formed, a polysilicon layer 16 doped with impurities and an silicon oxide film 8 are formed in that order over the entire surface of the body. The oxide film 8 is then patterned to be removed except portions thereof to define a base electrode. The polysilicon layer 16 is thereafter selectively removed in an anisotropically etching manner by using the patterned oxide film 8 as a mark. The base electrode 16 is thus formed.

It is noted, however, that the formation of the base electrode 16 is accomplished with much difficulty of stopping with a high precision at the interface between the portion of the electrode 16 and n-type epitaxial layer 3. For this reason, it is unavoiable that part of the surface portion of n-type epitaxial layer 3 in which the emitter region is to be formed is excessively etched. Such an excessive etching of the layer 3 is made larger in order to completely remove the parts of the polysilicon layer 16 covering the stepped edge portions 17 of the field oxide layer 4, as shown in FIG. 1.

Thereafter, a heat treatment is carried to diffuse the impurities in the layer 16 into the layer 3. Consequently, as shown in FIG. 2, an extrinsic base region 14 is formed in the layer 3 as a collector region. Ion-implantation is then carried out to form an intrinsic base region 13, followed by forming a sidewall oxide film 9 by the well-know technique. A polysilicon layer 11 doped with impurities are thereafter formed, and an emitter region 15 is then formed by duffusing the impurities from the layer 11 into the base region 15.

As described hereinbefore, however, due to the excessive overetch of the surface portion of the layer 3, the extrinsic and intrinsic base regions 14 and 13 are connected with a slight contact, as shown in FIG. 2. For this reason, the base resistance is remarkably increased to degradate the electrical characteristics of the transistor thus fabricated.

SUMMARY OF THE INVENTION

It is therefore an object of the present invention to provide a method of fabricating a bipolar transistor to overcome the above-mentioned drawback, A method according to the present invention is characterized in that an additional conductive layer such a polysilicon layer is inserted between a substrate and a layer for a base electrode.

This additional conductive layer thus prevents the part of the substrate from being excessively etched.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Referring FIG. 3, the first embodiment of the present invention will be described under.

Figure 1:
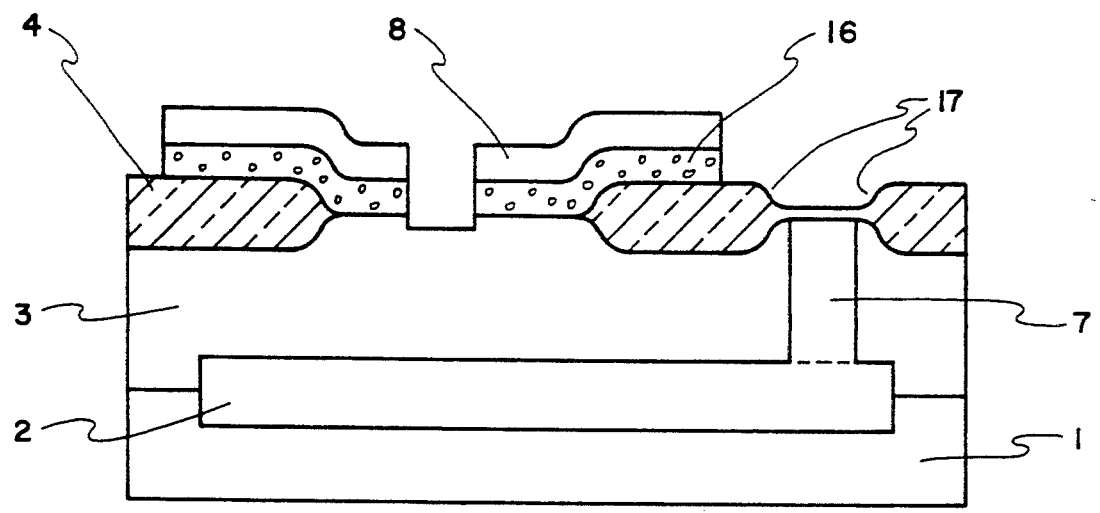
FIGS. 1 and 2 are cross-sectional views of a semiconductor device for illustrating a method according to prior art.
Figure 2:
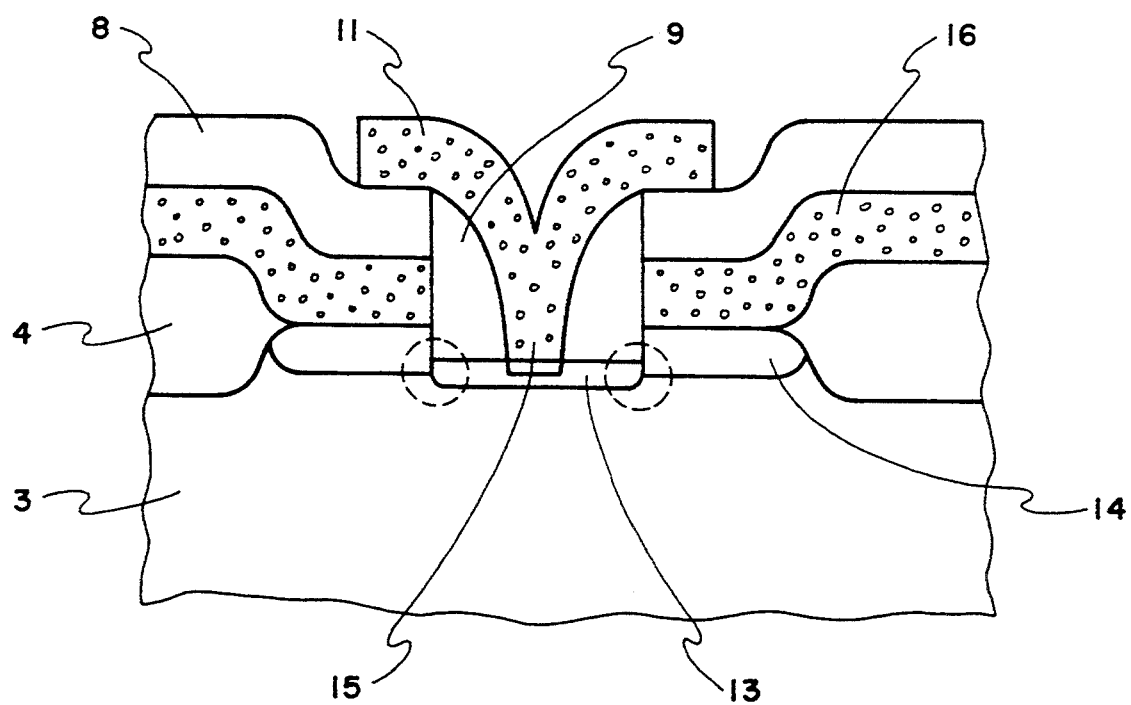

In the structure of the prior art bipolar transistor, the base electrode consists of the conducting film 16 only. In contrast with this, in the first embodiment of the present invention as illustrated in FIG. 1, the base contact is a double-layered structure consisting of the first and second conducting films 5, 6. This structure can prevent n-type epitaxial layer 3 in which the emitter diffused-region to be formed from being etched by the dry etching, which is performed for forming the base electrode. The area of the second conducting film 6 on the flat surface of the field oxide 4 can be fully etched away on the determination of the end point of the etching (by the known method of detecting the change of the plasma spectrum during etching). After that, only if the thickness of the first conducting film 5 is exactly measured, the film thickness of the first conducting film 5 can be etched away with the epitaxial layer 3 little etched away and without degradation of the transistor characteristics. Furthermore the etching residue at the edge of the device-isolating field oxide 4 can be removed simultaneously.

Referring to FIGS. 5a through 5f, the fabrication process for the first embodiment of the present invention will be set forth below.

Figure 5A:
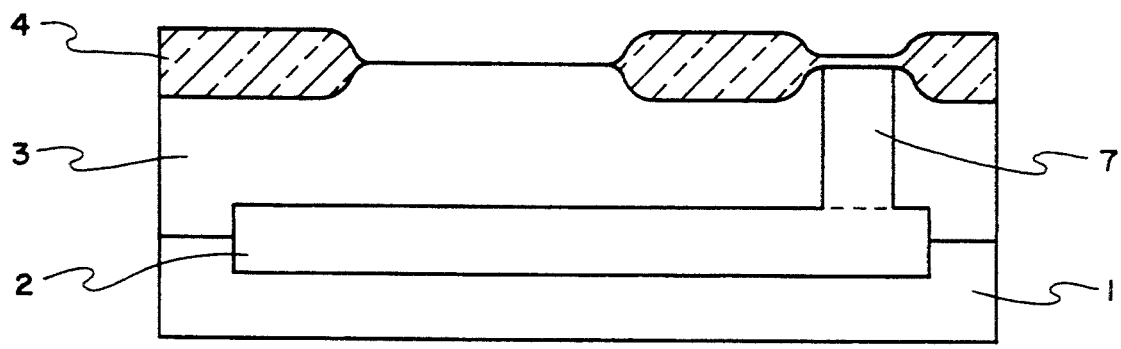
FIGS. 5a through 5f are cross-sectional views for illustrating the process sequence for fabricating the semiconductor device of FIG. 3.

On a p-type semiconductor substrate 1 is built a structure consisting of an n+buried layer 2, an n-type epitaxial layer 3, and device-isolating field oxide 4, as shown in FIG. 5a.

Figure 5B:
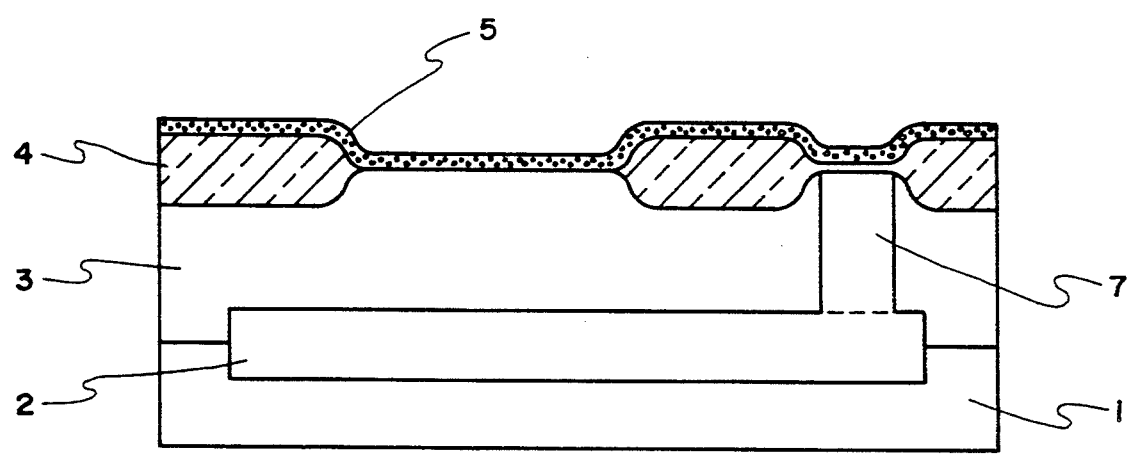

Over the surface, the first conducting film 5, such as polysilicon film, of 300 to 500 angstroms thick, is deposited by the known CVD technique, as shown in FIG. 5b.

Figure 5C:
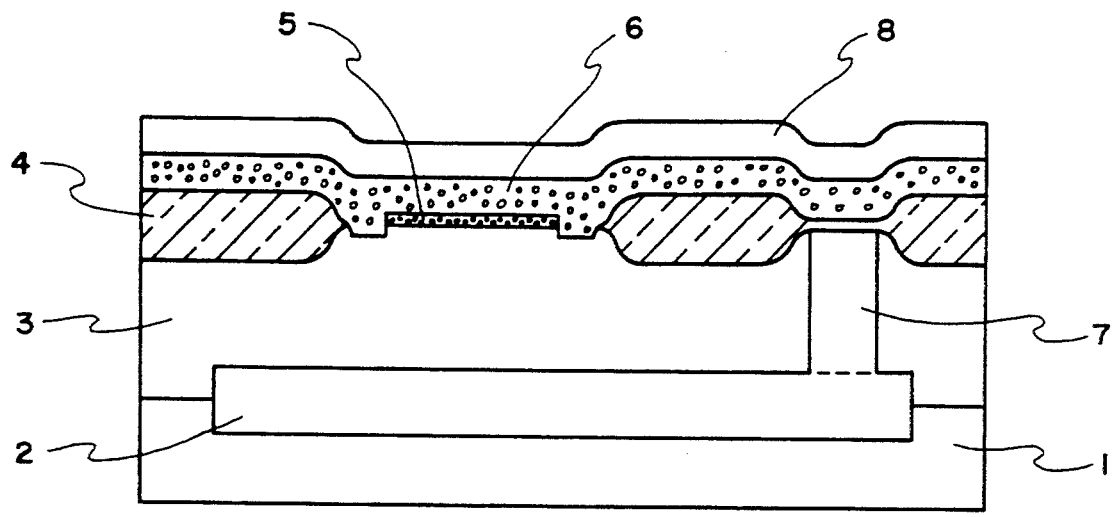

The first conducting film 5 can be patterned, as seen in FIG. 5c, using a mask, inevitably with a result of the n-type epitaxial layer 3 etched away by about 50 to 200 angstroms depth which is as very shallow as 1/20 to 1/5 compared with the prior art because such small thickness of the first conducting film 5 as 300 to 500 angstroms allows slight overetch for removing the etching residue of polysilicon at the stepped edge of the device-isolating field oxide, compared with the prior art. Over the surface, the second conducting film 6, such as polysilicon film, of 1500 to 2500 angstroms thick, and then an impurity for forming extrinsic base regions 14, such as boron, is doped at $10^{20}$ cm$^{-3}$ to $10^{21}$ cm$^3$ by ion implantation, thermal diffusion, or the in situ doping.

Similarly an impurity of the same conductivity type as that of extrinsic base region 14, such as boron, may be previously doped into the above-mentioned first conducting film 5, too, Over the surface, the first insulating film 8 is deposited by the known CVD technique.

Figure 5D:
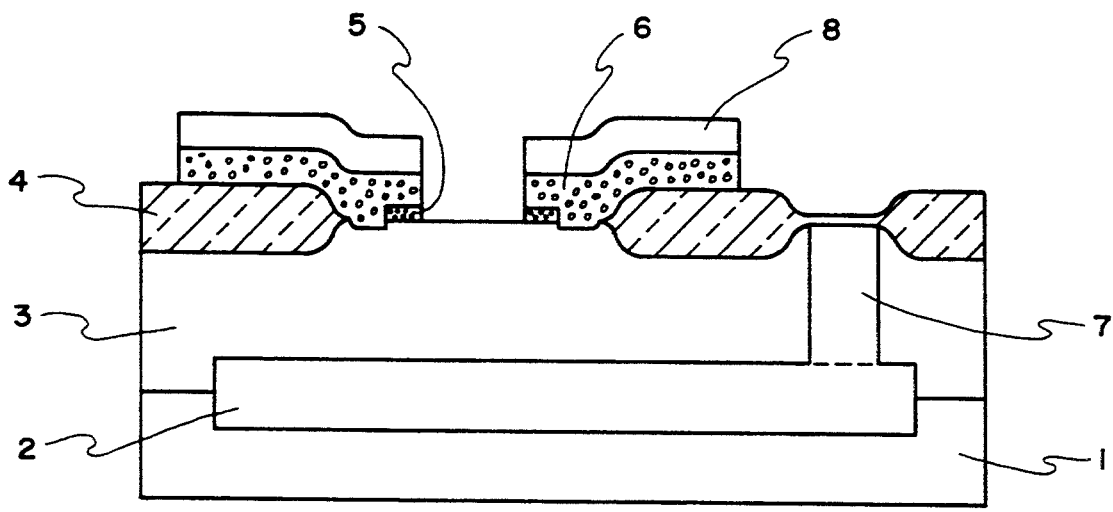

The base electrode is formed, by the known anisotropic etching technique with a mixed gas of CF$_4$ and O$_2$ under the conditions such as 800 W and 15 Pa, into the double-layered structure consisting of the first and second conducting films 5, 6 as shown in FIG. 5d. In this anisotropic etching step, the second conducting film 6 on the first conducting film and the flat surface of the field oxide 4 is fully etched away on the determination of the end point of the etching by detecting the change of the plasma spectrum, and then the measured film thickness of the first conducting film 5 is etched away. The etching residue of the second conducting film 6 at the edge of device-isolating field oxide 4 is etched away simultaneously with the etching of the first conducting film 5.

Figure 5E:
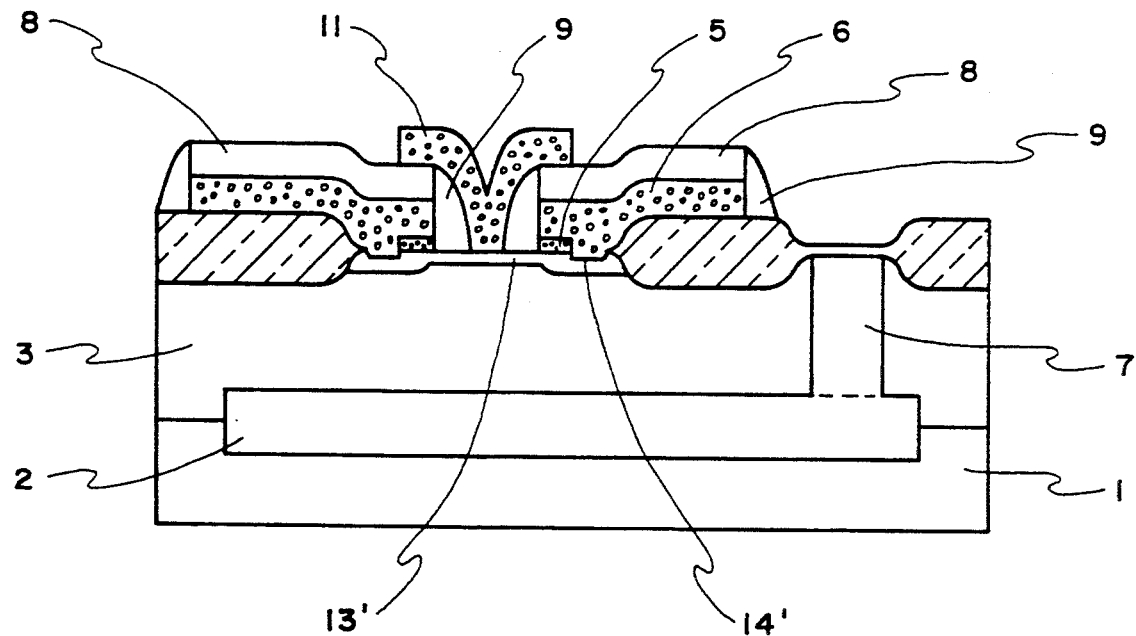
Figure 5F:
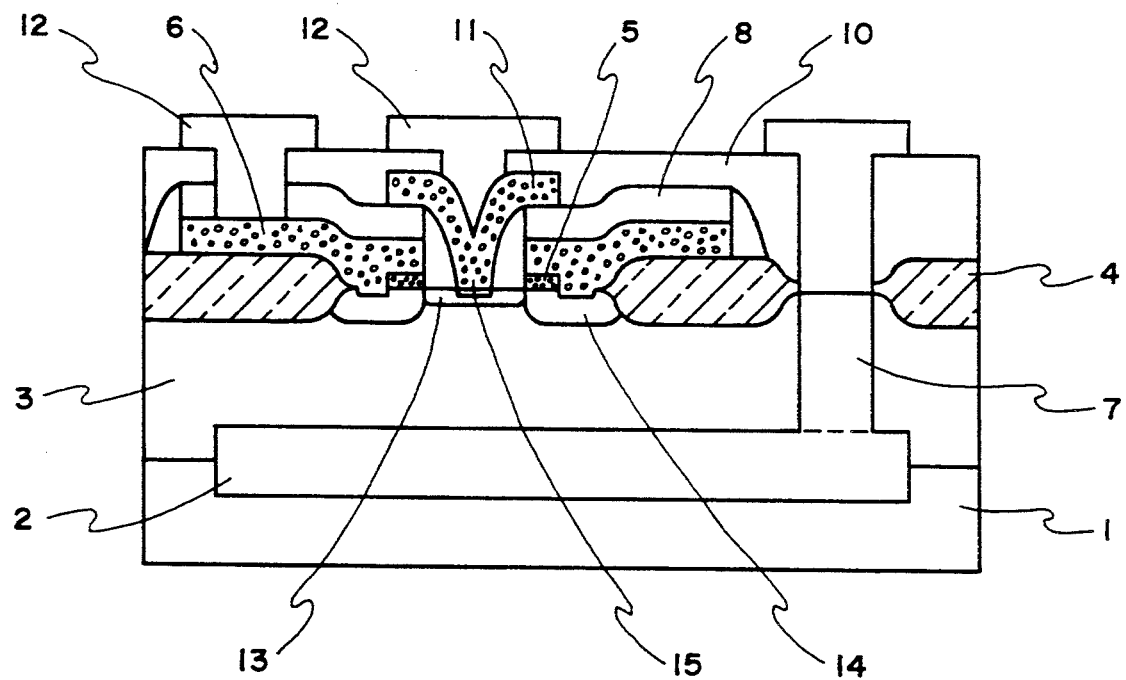

Referring to FIG. 5e, an impurity such as boron is doped at $10^{16}$ to $10^{18}$ cm$^{-3}$ by ion implantation, thermal diffusion, or the like, to form an intrinsic base region 14'. The second insulating film 9 is then deposited by the known CVD technique, and etched anisotropically to form sidewall spacer, following which an emitter electrode 11 is formed. Referring to FIG. 5f, the third insulating film 10 is deposited by the known. CVD technique and etched anisotropically to form contact holes. A contact electrode 12 is then formed.

Figure 4:
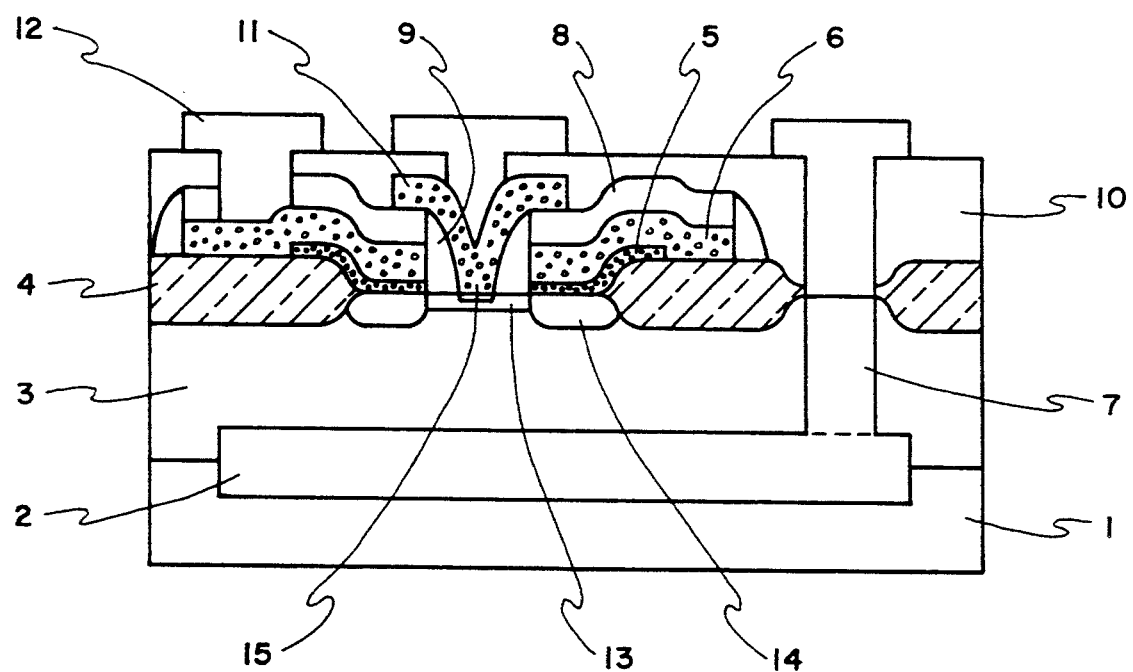
FIG. 4 is a cross-sectional view of another semiconductor device as a second embodiment of the present invention.
Figure 6A:
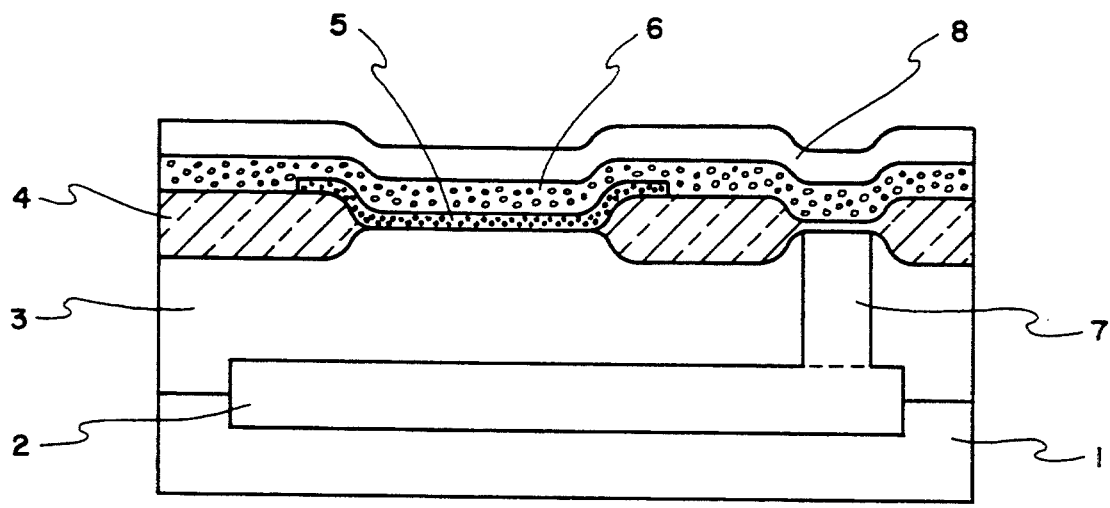
FIGS. 6a and 6b are cross-sectional views for illustrating the process sequence for fabricating the semiconductor device of FIG. 4.
Figure 6B:
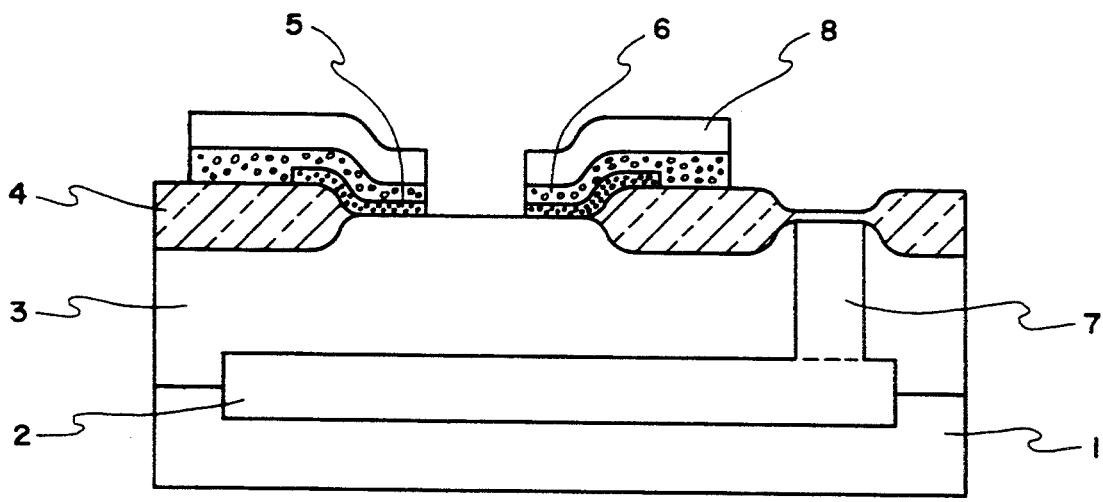

FIGS. 4, 6a and 6b are illustrative cross-sections of the semiconductor device as the second embodiment of the present invention of which the structure and the process for fabricating the same will be described below with reference to these Figures.

Referring to FIG. 4, the structure of the second-embodiment will be set forth.

The structure of the first-embodiment bipolar transistor has the first conducting film 5 formed on n-type epitaxial layer 3 in the extrinsic base-formed region while the second embodiment is constructed to have the first conducting film 5 overlapping the device-isolating field oxide 4.

Referring to FIGS. 6a and 6b, the fabricating process for the second embodiment of the present invention will be described below.

Referring to FIG. 6a, on a p-type semiconductor substrate 1, a structure is built which consists of an n$^+$buried layer 2, an n-type epitaxial layer 3, and device-isolating field oxide 4. Over the surface, the first conducting film 5 of 300 to 500 angstroms thick is deposited by the known CVD technique, and patterned using a mask to overlap the device-isolating field oxide 4, following which the second conducting film 6 of 1500 to 2500 angstroms and the first insulating film 8 are deposited.

Figure 3:
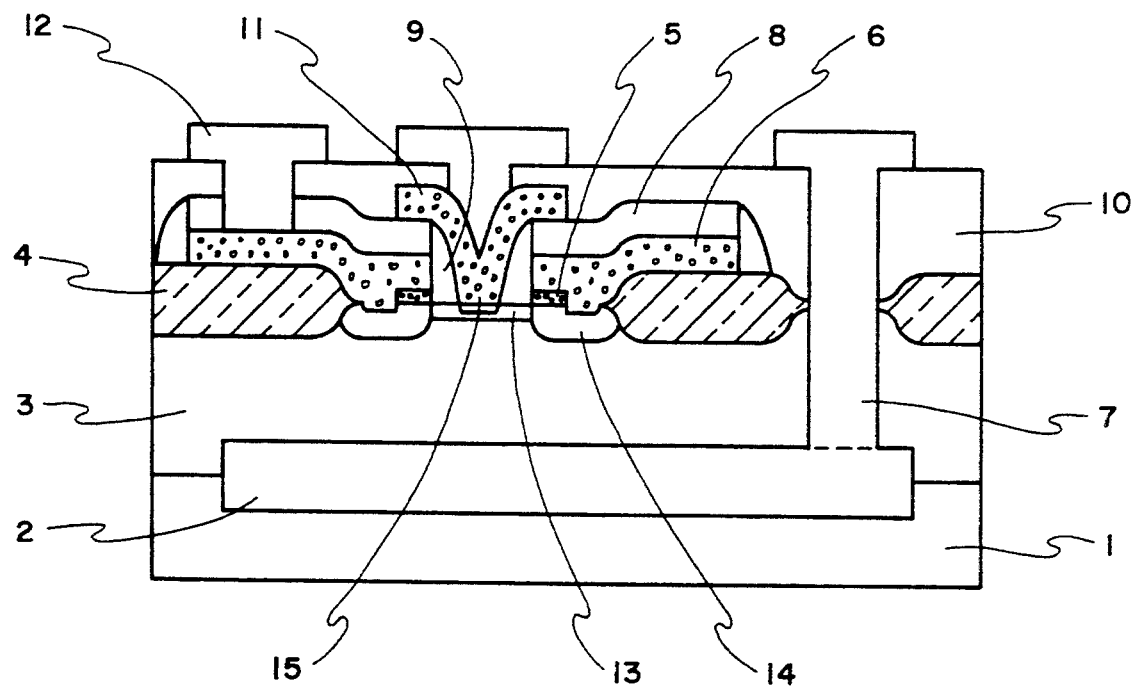
FIG. 3 is a cross-sectional view of a semiconductor device as a first embodiment of the present invention.

In the above-mentioned first embodiment illustrated in FIG. 3, the first conducting film 5 is formed on the substrate in the extrinsic base region 14 formed deeply as much as 2000 to 5000 angstroms by diffusing an impurity such as boron previously doped in the second conducting film 6 into n-type epitaxial layer 3. The first conducting film 5 therefore can be patterned without causing leakage-current problems because crystal defects as etching damage to n-type epitaxial layer 3, even if introduced to the depth of 500 to 1000 angstroms, would be contained in extrinsic base region 14, resulting in the absence of defects at the junction.

The depth of extrinsic base region 14 however can be predicted to be less than 2000 angstroms, taking further scale down of devices and further lower thermal treatment up to 900° C. into consideration. In this case, there is a danger of lowering the collector-base breakdown due to the surface damage of n-type epitaxial layer 3 and thereby decreasing the yield. As the countermeasure against this, the second embodiment of the present invention is so constructed for the first conducting film 5 to overlap device-isolating field oxide 4, and hence epitaxial layer 3 in the extrinsic base region also will not be etched away.

The base electrode in FIG. 6b is formed by the known anisotropic etching technique, as that in FIG. 5d.

As described above, the feature of the present invention resides in that the base electrode has a double-layered structure of the first and second conducting films 5, 6 built by first and second step of anisotropic etching (for etching vertically), and thereby the etch-residue of the conducting film at the stepped portion, called bird's beak', along the border between the device-isolating field oxide and the diffused layer can be removed without allowing the surface of the silicon substrate in the emitter diffused-region to be etched away.

Figure 7:
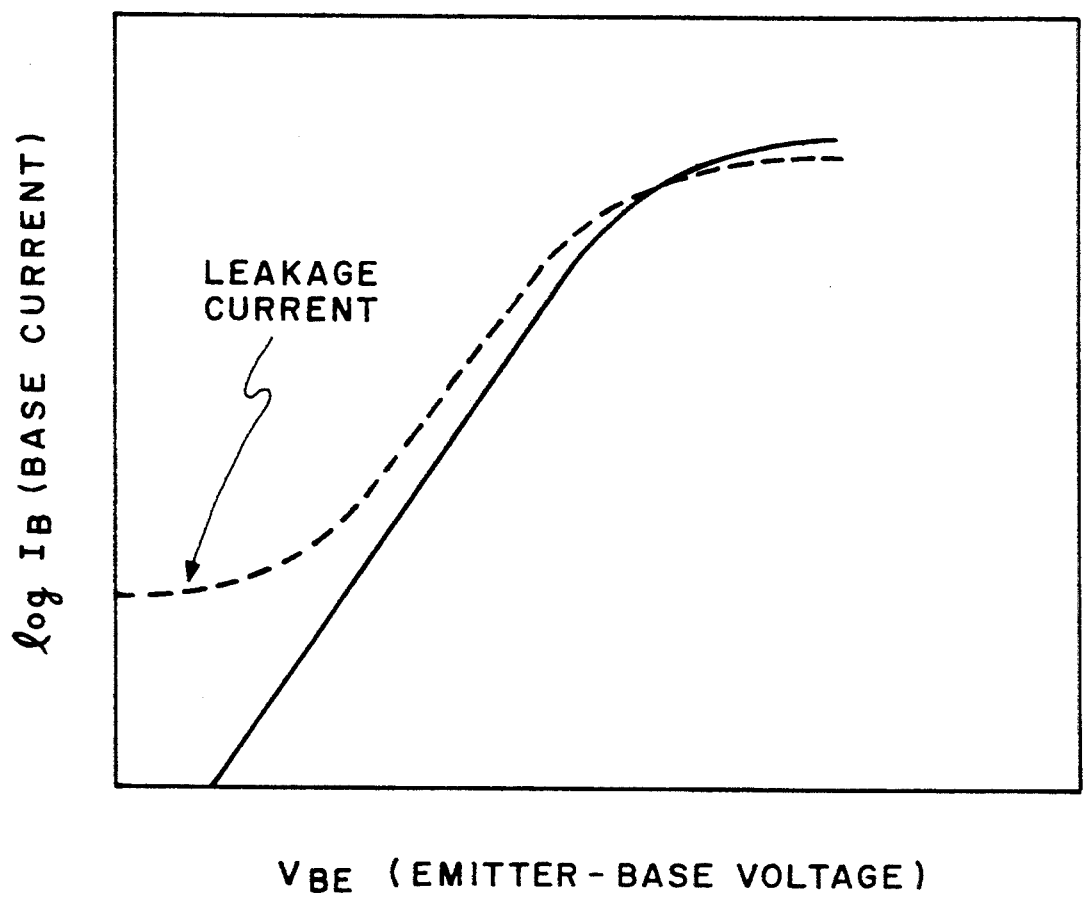
FIG. 7 shows graphs of the relationship between emitter-base voltage and base current, with the structures of the prior art and the present invention.

In virtue of this structure, the leakage current caused by doing damage to the surface of the silicon substrate in the emitter diffused-region is greatly reduced, as shown in FIG. 7, leading to avoidance of the problem with decrease in transistor yield.

What is claimed is:

1. A method of fabricating a bipolar transistor comprising the steps of selectively forming an insulating film to expose a surface of a part of a collector region, said surface of said part of said collector region comprising a first portion and a second portion surrounding said first portion, forming a first polysilicon layer on said surface of said part of said collector region with an area larger than said first portion, forming a second polysilicon layer on said first polysilicon layer, said second polysilicon layer being elongated over said insulating film to be in direct contact with said insulating film, said second polysilicon layer having a first part formed on said first polysilicon layer and a second part formed directly on said insulating film, performing a selective removal of respective portions of said first and second parts of said second polysilicon layer and stopping said selective removal at a time when said insulating film is exposed, said first polysilicon layer remaining to cover said surface of said part of said collector region, followed by forming a hole in said first polysilicon layer to expose said first portion of said surface of said part of said collector region, introducing impurities from said first and second polysilicon layers into said collector region to form an extrinsic base region, and introducing impurities into said first portion of said surface of said part of said collector region through said hole to form an intrinsic base region.

2. The method as claimed in claim 1, wherein said area of said first polysilicon layer is smaller than said surface of said part of said collector region to form an exposed portion in said second portion, said second polysilicon being formed to cover said exposed portion of said second portion.

3. The method as claimed in claim 1, wherein said area of said first polysilicon layer is larger than said surface of said part of said collector region to thereby being elongated over said insulating film.

4. The method as claimed in claim 1, wherein said selective removal is performed by a plasma etching method in which said second polysilicon layer is exposed to a plasma and said selective removal is stopped when a change of plasma spectrum occurs in said plasma due to said insulating film being exposed to said plasma.

* * * * *